United States Patent
Komatsuda et al.

[11] Patent Number: 5,615,047
[45] Date of Patent: Mar. 25, 1997

[54] ILLUMINATION APPARATUS AND EXPOSURE APPARATUS USING IT

[75] Inventors: Hideki Komatsuda, Kawasaki; Hideo Hirose, Kawaguchi; Takashi Mori, Kawasaki, all of Japan

[73] Assignee: Nikon Corporation, Japan

[21] Appl. No.: 259,761

[22] Filed: Jun. 14, 1994

[30] Foreign Application Priority Data

Jun. 18, 1993 [JP] Japan ................... 5-147389

[51] Int. Cl.⁶ ............ G02B 27/10; G02B 27/02; F21V 29/00
[52] U.S. Cl. .................. 359/618; 359/798; 362/268
[58] Field of Search .................... 359/618, 619, 359/798; 362/268, 271; 355/67, 71

[56] References Cited

U.S. PATENT DOCUMENTS

| | | | |
|---|---|---|---|
| 4,619,508 | 10/1986 | Shibuya | 362/268 |
| 4,851,978 | 7/1989 | Ichihara | 359/619 |
| 5,004,348 | 4/1991 | Magome | 356/401 |
| 5,237,367 | 8/1993 | Kudo | 362/268 |
| 5,251,067 | 10/1993 | Kamon | 362/268 |
| 5,305,054 | 4/1994 | Suzuki | 355/53 |
| 5,309,198 | 5/1994 | Nakagawa | 355/67 |
| 5,335,044 | 8/1994 | Shiraishi | 355/53 |
| 5,379,090 | 1/1995 | Shiraishi | 355/67 |
| 5,420,417 | 5/1995 | Shiraishi | 250/205 |
| 5,424,803 | 6/1995 | Noguchi | 355/53 |
| 5,459,547 | 10/1995 | Shiozawa | 355/67 |

FOREIGN PATENT DOCUMENTS

| | | |
|---|---|---|
| 62-115119 | 5/1987 | Japan . |
| 142821A | 2/1989 | Japan . |
| 5127085A | 5/1993 | Japan . |
| 5-127086A | 5/1993 | Japan . |

*Primary Examiner*—Georgia Y. Epps
*Assistant Examiner*—Ricky Mack
*Attorney, Agent, or Firm*—Pennie & Edmonds

[57] ABSTRACT

An illumination apparatus for uniformly illuminating an illuminated object surface. The apparatus comprises light source means for supplying an illumination light beam having parallel rays, an optical integrator for forming a plurality of beams from the illumination light beam from said light source means, a condenser optical system for converging the plurality of beams from said optical integrator to illuminate the illuminated object surface in a superimposed manner, and an optical member having a light quantity attenuator for transmitting said illumination light beam so as to attenuate a light quantity of said illumination light beam by a predetermined amount, said optical member being located at or in the vicinity of a position conjugate with said illuminated object surface.

12 Claims, 6 Drawing Sheets

(A)  (B)  (C)

(A) (B) (C)

ILLUMINATION APPARATUS AND EXPOSURE APPARATUS USING IT

BACKGROUND OF THE INVENTION

1. Field of the Invention

The present invention relates to an illumination apparatus for assuring to assure illuminance uniformity and an exposure apparatus using the illumination apparatus.

2. Related Background Art

Illumination apparatus having especially strict illuminance uniformity are employed in fabricating semiconductor devices, and particularly in fabricating highly integrated semiconductor devices, such as VLSI semiconductor devices. One of the methods for improving the illuminance uniformity is for example the method as suggested in Japanese Laid-open Patent Application No. 64-42821. The method employs such an arrangement that a plane-parallel, transparent member has a shielding portion for partially interrupting a beam incident into at least one of the small lens elements in a fly's eye integrator and the plane-parallel, transparent member is located a certain distance apart from the fly's eye integrator at the incident beam side thereof.

This method realizes a distribution of uniform illuminance on a surface to be illuminated by interrupting a part of beam incident into at least one lens element among a plurality of lens elements constituting the fly's eye integrator. By interrupting a part of beam incident into a small lens element in the fly's eye integrator, an amount of correction of illuminance unevenness is about 2% to 3%. It was, therefore, almost impossible that the illuminance adjustment by this method could achieve an illuminance distribution with 1% or less illuminance unevenness.

SUMMARY OF THE INVENTION

It is, therefore, an object of the present invention to provide an illumination apparatus which permits a finer control of illuminance so that satisfactorily uniform illuminance can be achieved over the entire surface of an illuminated object.

The above object and other objects will be further apparent from the following description.

Provided according to the present invention is an illumination apparatus for uniformly illuminating an illuminated object surface. The illumination apparatus comprises light source means for supplying an illumination light beam having parallel rays, an optical integrator for forming a plurality of beams from the illumination light beam from said light source means, a condenser optical system for converging the plurality of beams from said optical integrator to illuminate the illuminated object surface in a superimposed manner, and an optical member having a light quantity attenuator for transmitting said illumination light beam so as to attenuate a light quantity of said illumination light beam by a predetermined amount. The optical member is located at or in the vicinity of a position conjugate with said illuminated object surface.

Also provided according to the present invention, is an exposure apparatus in which a surface of a reticle is uniformly illuminated. The exposure apparatus comprises light source means for supplying an illumination light beam having parallel rays, an optical integrator for forming a plurality of beams from the illumination light beam from said light source means, a condenser optical system for converging the plurality of beams from said optical integrator to illuminate the illuminated object surface in a superimposed manner, a reticle stage movable in a direction perpendicular to an optical axis while carrying the reticle, a projection optical system for projecting a beam from the reticle onto a wafer, a wafer stage movable in the direction perpendicular to the optical axis while carrying the wafer, and an optical member having a light quantity attenuator for transmitting said illumination light beam so as to attenuate a light quantity of said illumination light beam by a predetermined amount. The optical member is located at or in the vicinity of a position conjugate with the surface of the reticle.

The above arrangement permits illuminance to be adjusted by an arbitrary small amount in an arbitrary portion on the surface of an illuminated object, which enables to form a far more uniform illuminance distribution on the surface of the illuminated object as compared with the conventional methods. For example, one of illuminance adjustment methods is applied to a case in which variations in the illuminance distribution on the surface of an illuminated object are within about 2%. According to the method of the present invention, in order to match with a low illuminance region on the surface of an illuminated object, the illuminance for other portions is adjusted to be lowered by a small amount, whereby a distribution of uniform illuminance can be achieved on the surface of the illuminated object. Another illuminance adjustment method is applied to a case in which variations in the illuminance distribution on the surface of an illuminated object are within several %. In this method, to match with the lowest illuminance region on the surface of illuminated object, the illuminance for other portions is adjusted stepwise to be lowered by a small amount, whereby a distribution of uniform illuminance can be achieved on the surface of illuminated object.

DESCRIPTION OF THE PREFERRED EMBODIMENTS

The present invention will be described in detail based on embodiments thereof.

The illuminance unevenness herein is defined as follows. Let U (%) be the illuminance unevenness, $I_1$ be a maximum value in an illuminance distribution on an illuminated object surface, and $I_2$ be a minimum value in the illuminance distribution on the illuminated object surface. Then $U=(I_1-I_2)\times100/(I_1+I_2)$.

Figure 1:
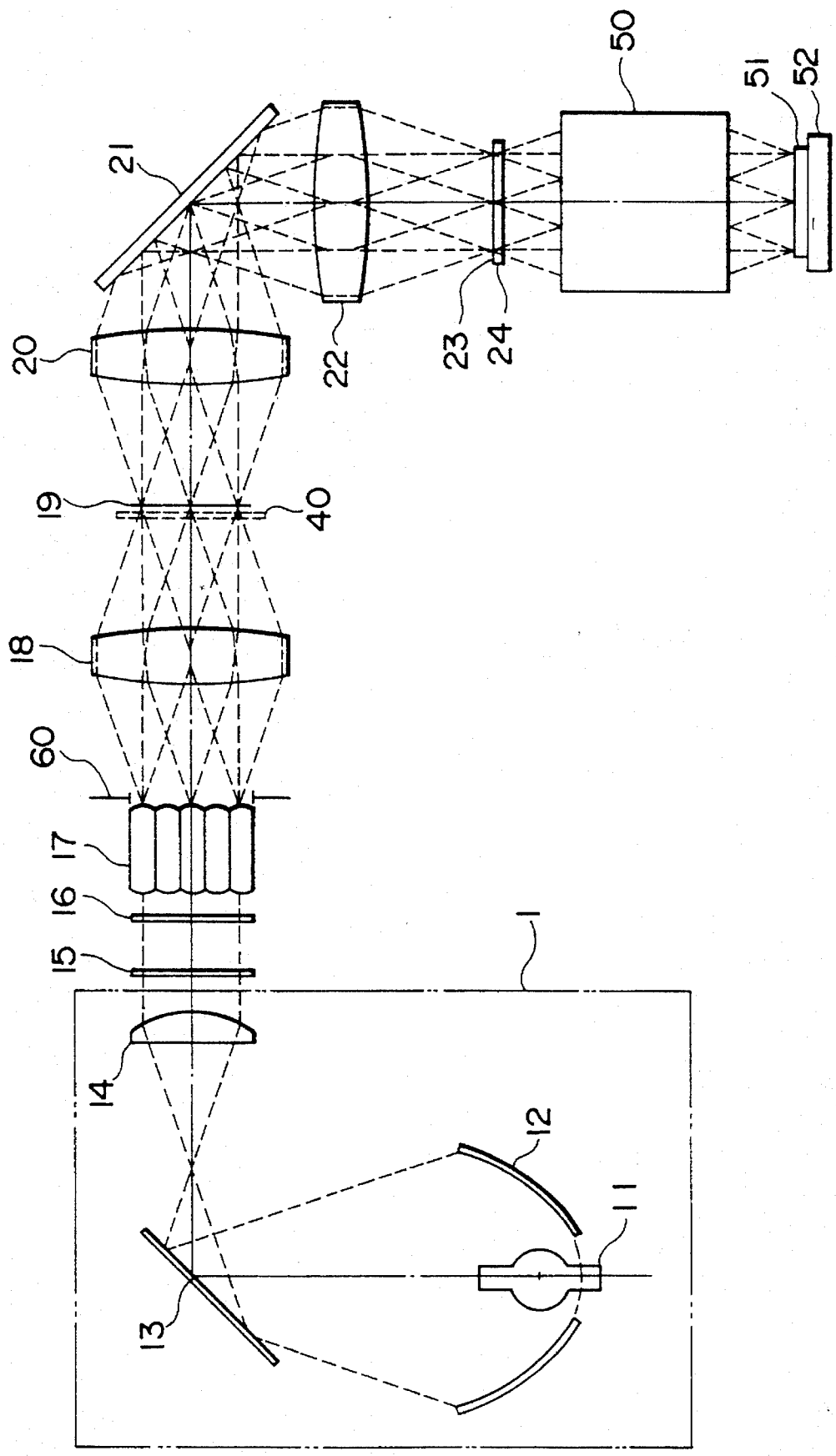
FIG. 1 is an optical structural drawing to show an illumination apparatus according to the present invention and the scheme of whole structure of an exposure apparatus using the illumination apparatus.

FIG. 1 is an optical structural drawing to show an illumination apparatus according to the present invention and the scheme of whole structure of an exposure apparatus using the illumination apparatus. A radiative point at the center of a super-high pressure mercury lamp 11 is located at the first focus of an elliptic mirror 12, so that a beam from the super-high pressure mercury lamp 11 is reflected and collected by the elliptic mirror 12 and the thus collected beam is reflected by a cold mirror 13. After that, the reflected beam is once focused at a point symmetric with the second focus of elliptic mirror 12 with respect to the cold mirror 13. Then the beam is collimated by a collimation lens 14 and the collimated beam is guided to a fly's eye integrator 17.

Here, the super-high pressure mercury lamp 11, the elliptic mirror 12, the cold mirror 13 and the collimation lens 14 constitute a light source portion 1 for supplying an illumination beam of nearly parallel rays. There are further arranged an interference filter 15 for transmitting only a beam in a desired wavelength region out of the beam of parallel rays from the light source portion 1, and a plane-parallel, transparent member 16 on which a light quantity attenuator is partially formed with distributed transmittances or with a constant transmittance.

The fly's eye integrator 17 is an aggregation of lens elements in which a plurality of lens elements are bundled. Passing through the fly's eye integrator 17, the parallel rays from the collimation lens 14 form converged points in a number equal to the number of small lenses constituting the fly's eye integrator 17 on the exit side thereof, where secondary light sources (as surface illuminant) are formed substantially. An aperture stop 60 is located at a position where this secondary light sources to form the secondary light source so as to have a predetermined shape. Beams from the secondary light sources are converged by a partial condenser lens 18 to illuminate in a superimposed manner an aperture of field stop 19 located at the rear focus position of the partial condenser lens 18. Then light passing through the field stop 19 is guided to a relay optical system.

The relay optical system is composed of a first relay lens 20 and a second relay lens 22. A mirror 21 for bending the optical path is set between the first and second relay lenses 20, 22. A condenser optical system is constituted by the partial condenser lens 18, the first relay lens 20 and the second relay lens 22.

After the plurality of beams illuminating the aperture of field stop 19 in a superimposed manner passage through the aperture of field stop 19, the beams advance via the first relay lens 20, the mirror 21 and the second relay lens 22 to illuminate the illuminated object surface 23 in a superimposed manner, where an image of the field stop 19 is formed.

For example, a reticle 24 is placed as an illuminated object on the illuminated object surface 23. A desired circuit pattern formed on the reticle 24 is projected by a projection objective lens system 50 onto the top surface of wafer 51 mounted on a wafer stage 52.

The entrance plane of fly's eye integrator 17 is conjugate with the illuminated object surface 23 with respect to the fly's eye integrator 17 and the condenser optical system 18, 20, 22, while the field stop 19 is conjugate with the illuminated object surface 23 with respect to the relay optical system 20, 22.

Figure 2:
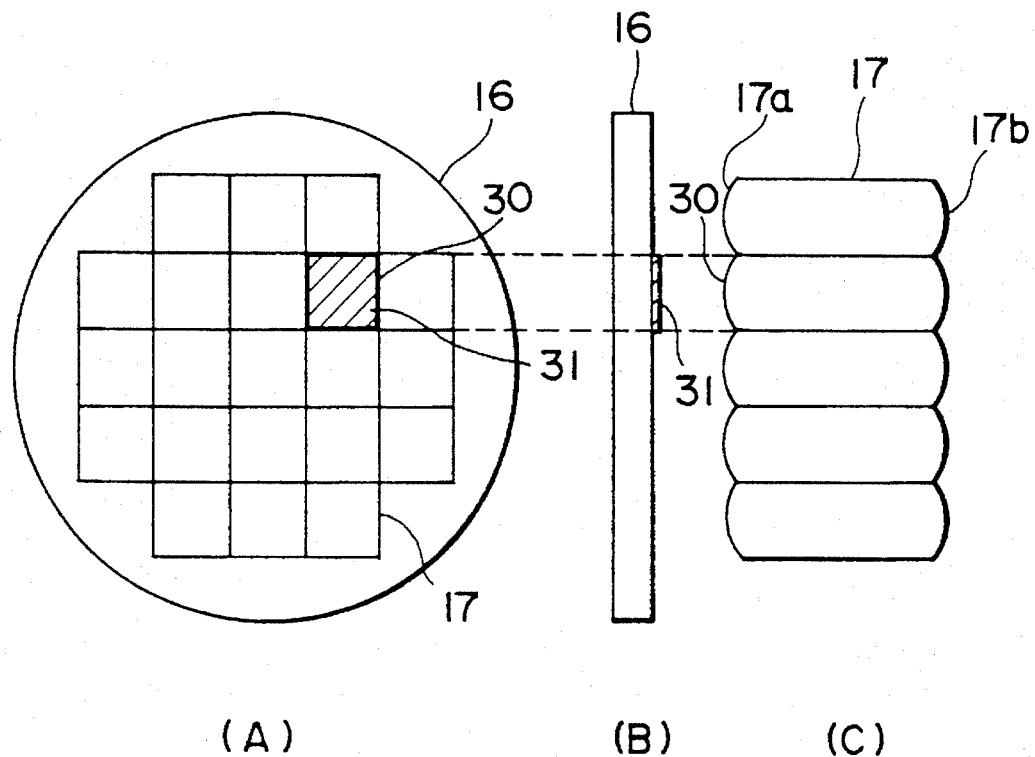
FIG. 2 is a drawing to show a positional relation between a plane-parallel, transparent member 16 and a fly's eye integrator 17, in which (A) is a plan view to view the fly's eye integrator 17 through the plane-parallel, transparent member 16 having a light quantity attenuator 31 and in which (B) and (C) show a positional relation as seen from the side of (A) between the plane-parallel, transparent member 16 and the fly's eye integrator 17.

Next detailed referring to FIG. 2 is the plane-parallel, transparent member 16 located in the vicinity of the entrance plane of fly's eye integrator 17.

(A) of FIG. 2 is a plan view to view the fly's eye integrator 17 through the plane-parallel, transparent member 16, and (B) and (C) of FIG. 2 show a positional relation as seen from the side of (A) between the plane-parallel, transparent member 16 and the fly's eye integrator 17. As shown in FIG. 2, a light quantity attenuator 31 is formed on the plane-parallel, transparent member 16 in order to control a light quantity of a beam incident into a lens element 30 among numerous lens elements constituting the fly's eye integrator 17. The light quantity attenuator 31 is so formed as to cover the entire surface of the lens element 30. The light quantity attenuator 31 is composed of an aggregation of fine dots formed by continuously changing the density of fine dots of a light-shielding metal such as chromium, having a transmittance distribution. The light quantity attenuator 31 may be formed as an aggregation of fine transmissive dots or formed of a dielectric thin film with a continuously changing transmission distribution.

The method for forming the fine dots will be described in the following.

The illuminance is first measured on the illuminated object surface 23 by means of an illuminometer having an aperture of diameter 0.5 mm and being capable of measuring the illuminance of a fine region.

It is often the case that data obtained here can be expressed by a simple function. This is because the optical system is normally a body of revolution around the optical axis, and therefore the illuminance unevenness is frequently determined by a distance from the optical axis. In that case, a region on the illuminated object surface is finely divided by a proper method and the illuminance of each fine region is calculated using the function.

If the data cannot be expressed by a simple function, the illuminance of each fine region on the illuminated object surface 23 can be determined through the interpolation of collected data.

Here, let E be the illuminance of each fine region and $E_{min}$ be a minimum value among E. Suppose a beam incident into the fly's eye integrator 17 is uniform, n lens elements 30 are contributing to the illumination, and m of n lens elements each has a light quantity attenuator 31 formed thereon. Then the transmittance T at a position corresponding to each fine region of the light quantity attenuator 31 is obtained as follows:

$$T=1-(1-E_{min}/E)n/m.$$

Further, in the case that the intensity distribution of the light beam incident into the fly' eye 17 is not uniform as Gaussian distribution, a center portion of an incident surface of the fly's eye integrator 17 is bright, that is, the light intensity in the center portion is high, and a peripheral portion of the incident surface is dark in comparison with the center portion, that is. the light intensity in the peripheral portion is low. In this case, the transmittance T is obtained as follows:

$$T=1-(1-E_{min}/E)n/(km).$$

wherein k is a coefficient corresponding to the light intensity changing according to an incident position of the fly's eye-integrator 17.

Further, in the case that the light quantity attenuators 31 of which number is the same as that of the lens elements of the fly's eye integrator 17 are provided so that all of the lens elements respectively correspond to the light quantity attenuators, that is, n equal to m, it is not necessary to consider the intensity difference between the lights in the incident surface of the fly's eye integrator. In this case, the transmittance T is obtained as follows:

$$T=1-(1-E_{min}/E).$$

Besides, it is possible to make a pattern to be formed on the wafer 51 of a small size by providing an aperture stop with a ring shape opening or 4 openings each having a center shifted from thereof instead of the aperture stop having a circular opening located in an emitting surface side of the fly's eye integrator 17. Alternatively, it is possible to determine the illumination condition so as to present the best illumination by constructing the aperture, which is located at the emitting surface side of the fly's eye integrator, so that the aperture size is variable and changing the aperture size of this aperture stop. In both cases, it is preferable to provide the light quantity attenuators 31 of which number is the same as that of the lens elements of the fly's eye integrator 17 so that the plural lens elements correspond to the light quantity attenuators. In the arrangement, there is no problem that any attribution of each lens element constructing the fly's eye integrator 17 to the illumination changes.

Next, using a laser pattern generator, dots are written on an original plate having a size several times larger than that of the light quantity attenuator 31. On this occasion points in a number as defined by the following formula are written at random in a fine region with area R.

$$n_D=[R/a](1-T)$$

where $n_D$ is the number of the dots, a is an area of dots and T is the transmittance as obtained above.

Finally, reduction exposure is conducted to print the pattern on the original plate onto a filter, whereby a light quantity attenuator 31 can be obtained with desired fine dots formed thereon.

Figure 3:
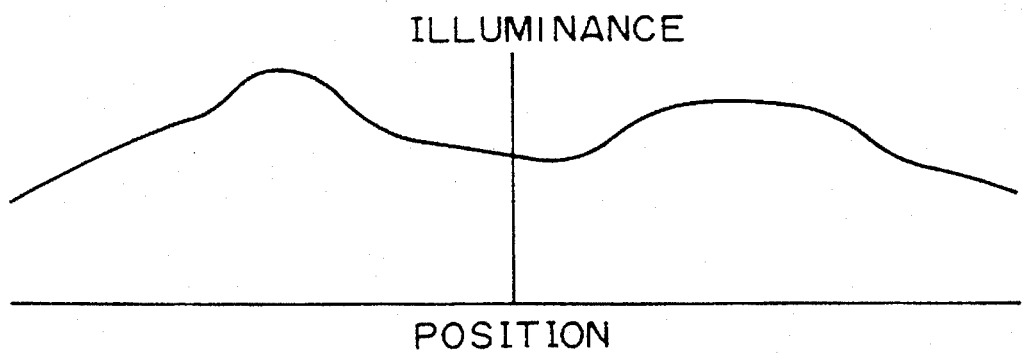
FIG. 3 is a drawing to show an illuminance distribution on an illuminated object surface 23 without correction of illuminance unevenness.
Figure 4:
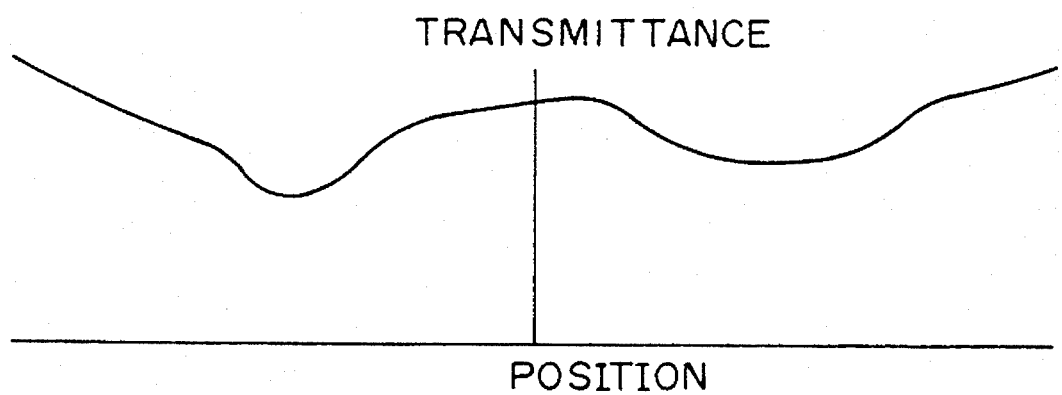
FIG. 4 is a drawing to show a transmittance distribution of the light quantity attenuator 31 formed on the plane-parallel, transparent member 16 as shown in FIG. 2.

Suppose an illuminance distribution has small illuminance unevenness (for example, illuminance variations of about 1% to 2%) as shown in FIG. 3 on the illuminated object surface 23 when the plane-parallel, transparent member 16 is not set in the apparatus (i.e., when the illuminance unevenness is not corrected yet). In this case, the light quantity attenuator 31 formed on the plane-parallel, transparent member 16 is arranged to have a transmittance distribution characteristic nearly inverse to the illuminance distribution of FIG. 3, as shown in FIG. 4. It should be noted that FIG. 3 emphasizes illuminance variations in order to facilitate discrimination of a state of illuminance unevenness.

Figure 5:
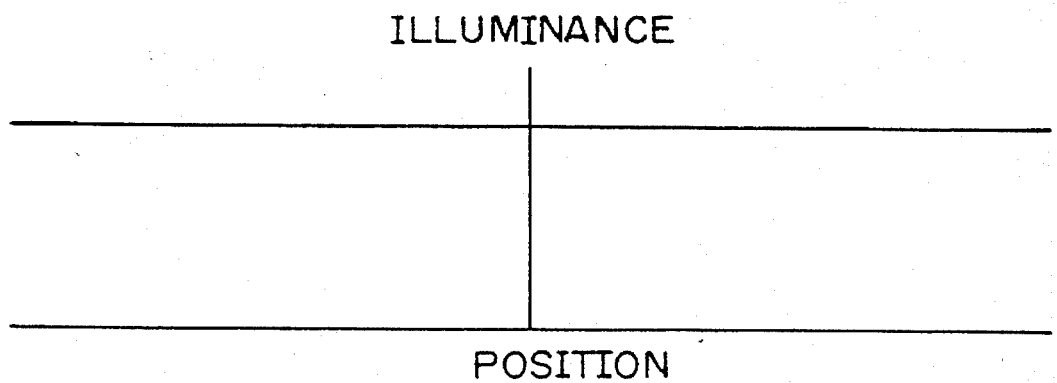
FIG. 5 is a drawing to show an illuminance distribution on the illuminated object surface 23 with correction of illuminance unevenness by the arrangement of plane-parallel, transparent member 16 as shown in FIG. 2.

A local beam having passed through the lens element 30 after the light quantity attenuation by the light quantity attenuator 31 travels together with a plurality of local beams having passed through the other lens elements via the partial condenser lens 18, the field stop 19, the first relay lens 20, the mirror 21 and the second relay lens 22 to illuminate the illuminated object surface 23 in a superimposed manner. Then, the light quantity attenuation by the light quantity attenuator 31 eliminates the small illuminance unevenness on the illuminated object surface 23 shown in FIG. 3, adjusting the illuminance so as to obtain a uniform illuminance distribution as shown in FIG. 5 on the illuminated object surface 23.

Suppose, as a next example, an illuminance distribution having relatively large illuminance unevenness (for example, 2% or more illuminance variations) is formed on the illuminated object surface 23 when the plane-parallel, transparent member 16 is not set in the apparatus (i.e., when the illuminance unevenness is not corrected yet). In this case, a plurality of light quantity attenuators 31 having a transmission distribution characteristic nearly inverse to the illuminance distribution on the illuminated object surface 23 are formed on the plane-parallel, transparent member 16, corresponding to a plurality of lens elements in the fly's eye integrator 17. It is preferred in this case that the one or more light quantity attenuators 31 each are formed on the plane-parallel, transparent member 16 so as to cover a whole beam incident into a corresponding lens element.

As a further example, a plurality of light quantity attenuators 31 having mutually different transmittance distribution characteristics are formed on the plane-parallel, transparent member 16, corresponding to a plurality of lens elements in the fly's eye integrator 17. In this case, transmittance distributions of the light quantity attenuators 31 each are so determined as to make uniform an illuminance distribution finally formed on the illuminated object surface 23 by superimposed illumination of beams having passed through the lens elements. Accordingly, each of the light quantity attenuators 31 in this case does not have to be formed to cover a whole beam incident into each lens element on the plane-parallel, transparent member 16, but they may be formed each to cover a part of beam incident into each lens element.

Figure 6:
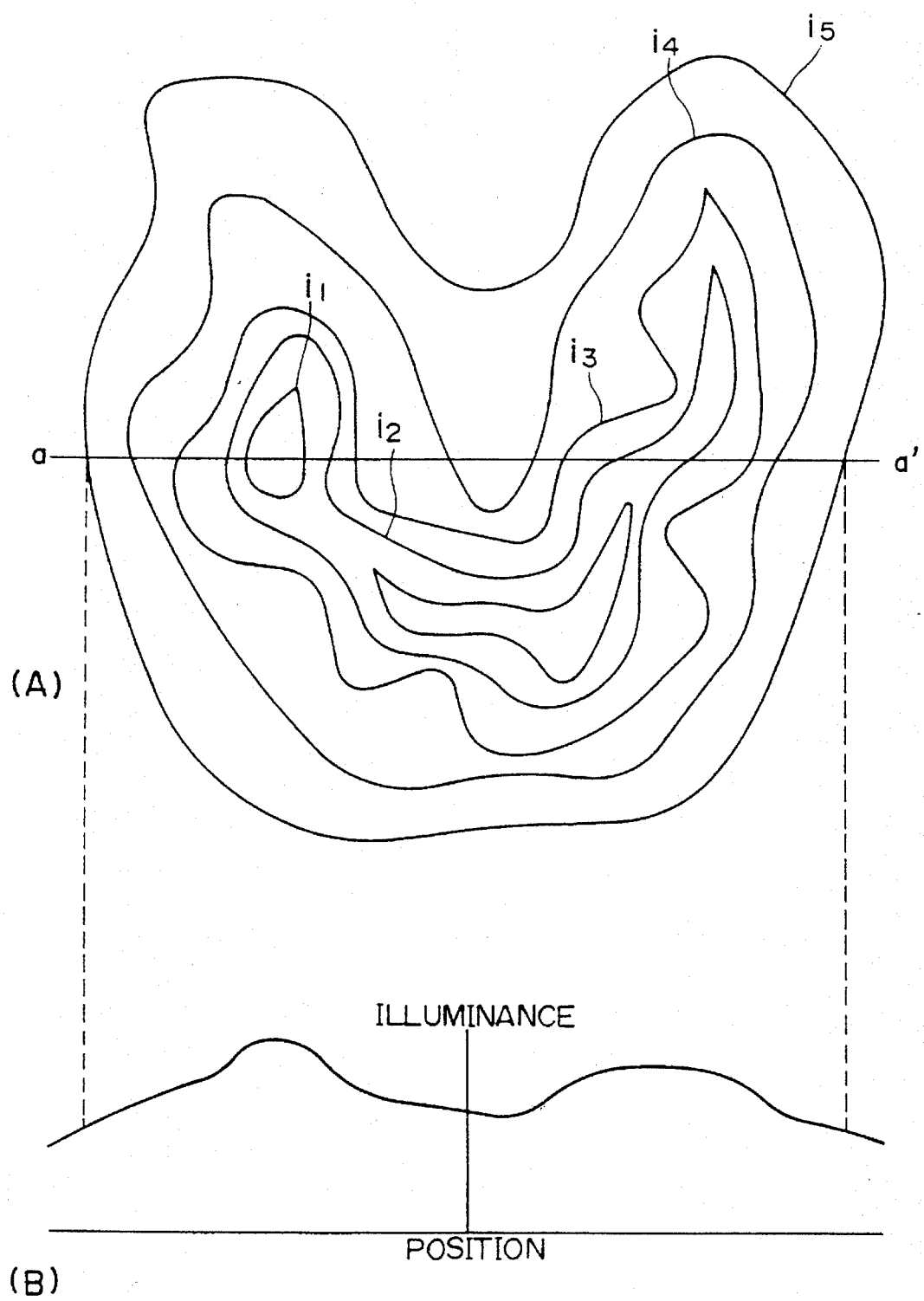
In FIG. 6, (A) shows equiilluminance curves $i_1$ to $i_5$ on an illuminance distribution on the illuminated object surface 23 as seen in the direction perpendicular thereto without correction of illuminance unevenness, and (B) shows a distribution of illuminance values along a–a' line in (A)

Next described is another embodiment according to the present invention. Let us consider an example in which illumination on the illuminated object surface 23 has illuminance unevenness as shown in FIG. 6 when the plane-parallel, transparent member 16 is not set yet (i.e., when the illuminance unevenness is not corrected yet). (A) of FIG. 6 shows equiilluminance curves $i_1$ to $i_5$ as obtained when the illuminance distribution formed on the illuminated object surface 23 is observed in the direction perpendicular thereto, and (B) of FIG. 6 shows a state of a distribution of illuminance values along a-a' line in (A). In (A) of FIG. 6, the equiilluminance curves $i_1$ to $i_5$ each represent a trace of portions with illuminance of 99.5%, 99.0%, 98.5%, 98.0% or 97.5%, respectively, if the maximum illuminance is 100%. It should be noted that (B) of FIG. 6 emphasizes variations in the illuminance unevenness in order to show the state of illuminance unevenness distinctly.

Figure 7:
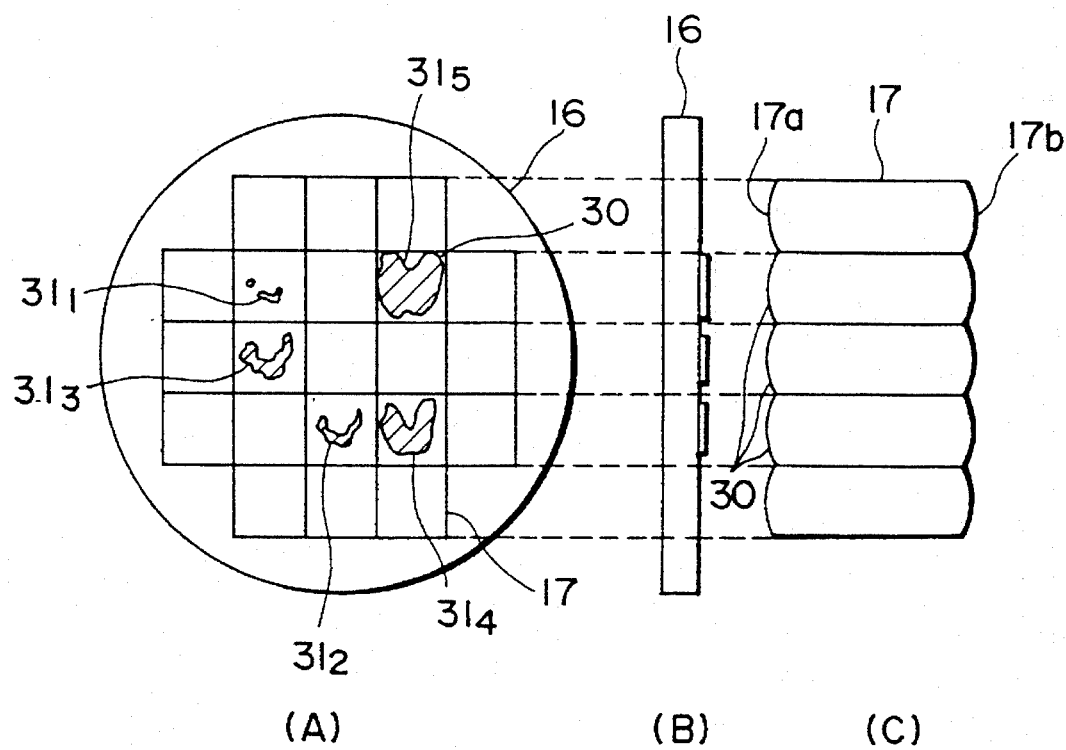
FIG. 7 is a drawing to show a positional relation between a plane-parallel, transparent member 16 and a fly's eye integrator 17, in which (A) is a plan view to view the fly's eye integrator 17 through the plane-parallel, transparent member 16 having light quantity attenuators $31_1$ to $31_5$ and in which (B) and (C) show a positional relation as seen from the side of (A) between the plane-parallel, transparent member 16 and the fly's eye integrator 17.

In the present embodiment, in order to correct the illuminance unevenness as shown in FIG. 6, five light quantity attenuators $31_1$ to $31_5$ having similar shapes to those formed by the five equiilluminance curves $i_1$ to $i_5$ in (A) of FIG. 6 are formed on the plane-parallel, transparent member 16, as shown in FIG. 7, corresponding to five lens elements in the fly's eye integrator 17.

Figure 8:
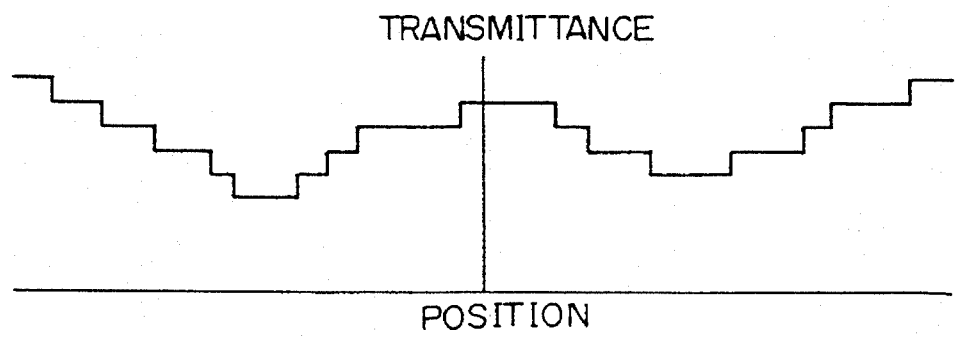
FIG. 8 is a drawing to show a transmittance distribution obtained as a combination of transmittances of light quantity attenuators $31_1$ to $31_5$ formed on the plane-parallel, transparent member 16 in FIG. 7.

The light quantity attenuators $31_1$ to $31_5$ each are formed of a dielectric thin film having a constant transmittance, so that they are equal in value of transmittance to each other. The light quantity attenuators $31_1$ to $31_5$ may be composed of an aggregation of fine light-shielding or transmissive dots as distributed at a constant density. FIG. 8 shows a transmittance distribution state as obtained when the transmittances of light quantity attenuators $31_1$ to $31_5$ are combined with each other. Thus superimposing beams having passed through the light quantity attenuators $31_1$ to $31_5$ on each other, a finally obtained transmittance distribution becomes similar to the transmittance distribution of FIG. 4 obtained by the single light quantity attenuator 31.

As understood from FIG. 8, the transmittance distribution obtained by combining the transmittances of light quantity attenuators $31_1$ to $31_5$ is nearly inverse to the illuminance distribution of (B) in FIG. 6 showing the case without correction of illuminance distribution on the illuminated object surface 23. Accordingly, forming the light quantity attenuators $31_1$ to $31_5$ having the five different shapes and being equal in transmittance to each other on the plane-parallel, transparent member 16 as corresponding to the five lens elements, as shown in FIG. 7, and locating the plane-parallel, transparent member 16 in the vicinity of the entrance plane of fly's eye integrator 17, the illuminance distribution on the illuminated object surface 23 is not perfectly flat but the illuminance variations can be suppressed within 1% in theory, as shown in FIG. 9, obtaining a much more uniform illuminance distribution than those by the conventional methods.

Figure 9:
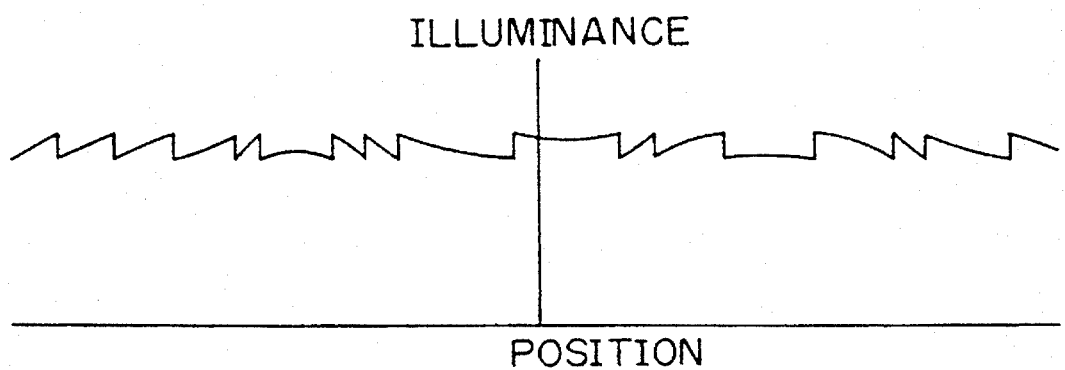
FIG. 9 is a drawing to show an illuminance distribution on the illuminated object surface 23 with correction of illuminance unevenness by the arrangement of the plane-parallel, transparent member 16 as shown in FIG. 7.

Although the present embodiment shows an example in which the five illuminance segments are employed at 0.5% intervals between 100% and 97.5% as shown in (A) of FIG. 6 and in which the five light quantity attenuators $31_1$ to $31_5$ similar in shape to the equiilluminance curves $i_1$ to $i_5$ in the illuminance distribution for the illuminance segments are formed on the plane-parallel, transparent member 16, the illuminance distribution shown in FIG. 9 can be further improved to be far more uniform by such an arrangement that the illuminance region between 100% and 97.5% is divided into more than five segments and that a plurality of light quantity attenuators similar to corresponding equiilluminance curves in the illuminance distribution for the divided segments are formed on the plane-parallel, transparent member 16.

The above description concerns the examples in which the plane-parallel, transparent member 16 having the light quantity attenuator(s) is located in the vicinity of the position of entrance plane of fly's eye integrator 17 as conjugate with the illuminated object surface 23, but the invention is by no means limited to the above examples. For example, instead of the plane-parallel, transparent member 16, a plane-parallel, transparent member 40 having a light quantity attenuating portion may be located in the vicinity of the position of the field stop 19 conjugate with the illuminated object surface 23 (before or after the field stop 19), as shown by the broken line in FIG. 1.

The following describes a preferable arrangement of a light quantity attenuating portion 41 on a plane-parallel, transparent member 40 located in the vicinity of the position of field stop 19.

Figure 10:
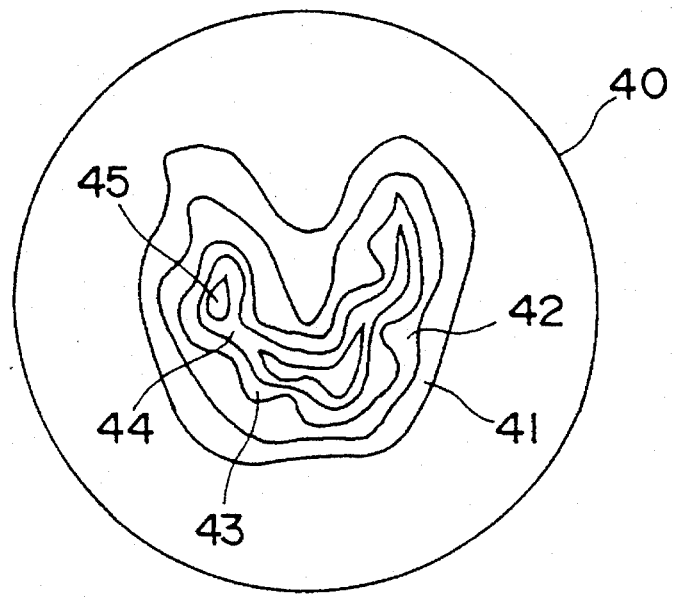
FIG. 10 is a drawing to show a state of an aperture of field stop 19 through a plane-parallel, transparent member 40 from the light source side.

Suppose the illuminance without the plane-parallel, transparent member 40 has the above-described illuminance unevenness as shown in FIG. 6. In this case, five light quantity attenuators 41 to 45 have similar shapes to those formed by the five equiilluminance curves $i_1$ to $i_5$ in (A) of FIG. 6 and are formed on the plane-parallel, transparent member 40 as being superimposed similar to the equiilluminance curves in (A) of FIG. 6. FIG. 10 shows the plane-parallel, transparent member 40 with the five light quantity attenuators 41 to 45, observing the aperture of field stop 19 through the plane-parallel, transparent member 40 from the light source side.

The light quantity attenuators 41 to 45 are formed of respective dielectric thin films having mutually different transmittances, but the transmittance is constant throughout each of the light quantity attenuators 41 to 45. Therefore, there exists a constant difference between the transmittances. For example, in the above case of the equiilluminance curves $i_1$ to $i_5$ of (A) of FIG. 6 for the five segments (99.5%, 99.0%, 98.5%, 98.0%, 97.5%) at 0.5% intervals from the maximum illuminance, the light quantity attenuator 41 corresponds to the equiilluminance curve $i_5$ of the illuminance 97.5%, the light quantity attenuator 42 to the equiilluminance curve $i_4$ of the illuminance 98.0%, the light quantity attenuator 43 to the equiilluminance curve $i_3$ of the illuminance 98.5%, the light quantity attenuator 44 to the equiilluminance curve $i_2$ of the illuminance 99.0%, and the light quantity attenuator 45 to the equiilluminance curve $i_1$ of the illuminance 99.5%.

In order to correct the illuminance distribution shown in (B) of FIG. 6, the transmittances of the light quantity attenuators 41 to 45 are to be determined such that a combined transmittance of the light quantity attenuators 41 to 45 has a distribution as obtained by inverting the illuminance distribution of (B) in FIG. 6. Accordingly, the transmittances may be determined in an inverted relation of the above correspondence between the light quantity attenuators 41 to 45 and the corresponding equiilluminance curves $i_1$ to $i_5$, i.e. the transmittances may be set as follows: The transmittance of light quantity attenuator 41 is 99.5%; the transmittance of light quantity attenuator 42 is 99.5×97.5/98.0= 99.0%; the transmittance of light quantity attenuator 43 is 99.5×97.5/98.5=98.5%; the transmittance of light quantity attenuator 44 is 99.5×97.5/99.0=98.0%; and the transmittance of light quantity attenuator 45 is 99.5×97.5/99.5= 97.5%.

By setting the plane-parallel, transparent member 40 having the above-described light quantity attenuators 41 to 45 in the vicinity of the location of field stop 19, the variations in the illuminance distribution on the illuminated object surface 23 can be suppressed within 1% in theory, as shown in FIG. 9, thus obtaining a far more uniform illuminance distribution than those in the conventional methods. The light quantity attenuators 41 to 45 each may be made of an aggregation of fine light-shielding or transmissive dots in a constant distribution density.

The above description concerns the examples in which the plane-parallel, transparent member 16 or 40 is fixedly located at the position conjugate with the illuminated object surface 23. It is understood that the illuminance distribution on the illuminated object surface 23 can be finely adjusted by moving the member along the optical axis. In a further example, a plurality of plane-parallel, transparent members with respective light quantity attenuators different in shape or in number from each other may be arranged as interchangeable. This example can be applied to cases in which the illuminance distribution on the illuminated object surface 23 varies due to an unstable output from the light source or an environmental change.

Also, the above description concerns the examples in which the optical integrator is the fly's eye integrator 17 (fly's eye lens) being an aggregation of plural lens elements, but instead thereof, for example, a prismatic optical member of inner reflection type (rod optical integrator) or the like may be employed.

It is also possible that the present invention may be combined with the conventional technology as disclosed in Japanese Laid-open Patent Application No. 64-42821. For example, a conventional light-shielding portion and a light quantity attenuator of the present invention are formed on the plane-parallel, transparent member 16 or 40. This arrangement permits such an adjustment that the shielding portion functions to coarsely adjust the illuminance distribution as to be coarsely uniform and the light quantity attenuator functions to finely adjust the coarsely uniform illuminance distribution to about 1%.

As detailed above, the present invention is effective to adjust the illuminance by an arbitrary fine amount in an arbitrary portion on the illuminated object surface, enabling to form a far more uniform illuminance distribution on the illuminated object surface than those by the conventional methods.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An illumination apparatus for uniformly illuminating an illuminated object surface, comprising:

light source means for supplying an illumination light beam having parallel rays;

an optical integrator for forming a plurality of beams from the illumination light beam from said light source means, said optical integrator having a plurality of lens elements;

a condenser optical system for converging the plurality of beams from said optical integrator to illuminate the illuminated object surface in a superimposed manner; and an optical member having a light quantity attenuator for transmitting said illumination light beam so as to attenuate a light quantity of said illumination light beam by a predetermined amount and make the illuminance distribution of the illuminated object surface uniform, said optical member being located at a position substantially conjugate with said illuminated object surface, said light quantity attenuator including a predetermined uneven transmittance distribution, and said transmittance distribution of said light quantity attenuator having functions in which luminous flux incident on each of said lens elements in said optical integrator is controlled and luminous flux having a predetermined uneven light intensity distribution is guided to said optical integrator.

2. An illumination apparatus according to claim 1, wherein said optical member is located substantially on an entrance plane of said optical integrator.

3. An illumination apparatus according to claim 2, wherein said optical integrator is composed of a plurality of lens elements and said light quantity attenuator attenuates a beam incident into at least one lens element.

4. An illumination apparatus according to claim 3, wherein an attenuation rate of the light quantity by said light quantity attenuator continuously changes depending upon a position on said light quantity attenuator.

5. An illumination apparatus according to claim 4, wherein said light quantity attenuator comprises a plurality of attenuator elements.

6. An illumination apparatus according to claim 3, wherein said light quantity attenuator comprises a plurality of attenuator elements, said attenuator elements each having a constant attenuation rate of the light quantity.

7. An illumination apparatus according to claim 1, wherein said condenser optical system comprises a partial condenser optical system for condensing the plurality of beams from said optical integrator, a field stop which is illuminated in a superimposed manner by the illumination light beams from said partial condenser optical system, for defining an illumination region on said illuminated object surface, and a relay optical system for projecting an image of said field stop onto said illuminated object surface and wherein said optical member is located substantially at a position where said field stop is located.

8. An illumination apparatus according to claim 1, wherein said light quantity attenuator has a plurality of fine light-shielding portions each continuously changing a distribution density and the light quantity of said illumination light beam is attenuated by the predetermined amount by partially shielding said illumination light beam by said light shielding portions.

9. An illumination apparatus according to claim 1, wherein said light quantity attenuator has a plurality of fine transmissive portions each continuously changing a distribution density and the light quantity of said illumination light beam is attenuated by the predetermined amount by partially transmitting said illumination light beam through said transmissive portions.

10. An illumination apparatus according to claim 1, wherein said light quantity attenuator has a thin film with a predetermined value of transmittance.

11. An illumination apparatus according to claim 1, wherein said optical member is not fixedly located at the position conjugate with the illuminated object surface and wherein illuminance on said illuminated object surface is finely adjusted by moving said optical member in a direction of optical axis from the position conjugate with said illuminated object surface.

12. An exposure apparatus in which a surface of a reticle is uniformly illuminated, comprising:

light source means for supplying an illumination light beam having parallel rays;

an optical integrator for forming a plurality of beams from the illumination light beam from said light source means, said optical integrator having a plurality of lens elements;

a condenser optical system for converging the plurality of beams from said optical integrator to illuminate the illuminated object surface in a superimposed manner;

a reticle stage movable in a direction perpendicular to an optical axis while carrying the reticle;

a projection optical system for projecting a beam from the reticle onto a wafer;

a wafer stage movable in the direction perpendicular to the optical axis while carrying the wafer; and an optical member having a light quantity attenuator for transmitting said illumination light beam so as to attenuate a light quantity of said illumination light beam by a predetermined amount and make the illuminance distribution of the illuminated object surface uniform, said optical member being located at a position substantially conjugate with the surface of the reticle, said light quantity attenuator including a predetermined uneven transmittance distribution, and said transmittance distribution of said light quantity attenuator having functions in which luminous flux incident on each of said lens elements in said optical integrator is controlled and luminous flux having a predetermined uneven light intensity distribution is guided to said optical integrator.

* * * * *